United States Patent [19]

Osada

[11] Patent Number: 5,364,815
[45] Date of Patent: Nov. 15, 1994

[54] CRYSTAL ARTICLES AND METHOD FOR FORMING THE SAME

[75] Inventor: Yoshiyuki Osada, Atsugi, Japan

[73] Assignee: Canon Kabushiki Kaisha, Tokyo, Japan

[21] Appl. No.: 22,611

[22] Filed: Feb. 17, 1993

Related U.S. Application Data

[63] Continuation of Ser. No. 735,762, Jul. 29, 1991, abandoned, which is a continuation of Ser. No. 414,725, Sep. 28, 1989, abandoned, which is a continuation of Ser. No. 173,653, Mar. 25, 1988, abandoned.

[30] Foreign Application Priority Data

Mar. 27, 1987 [JP] Japan .................................. 62-73516

[51] Int. Cl.$^5$ ............................................. C30B 25/12
[52] U.S. Cl. ..................................... 437/99; 437/241; 117/95; 117/106; 117/913
[58] Field of Search ....... 156/610, 613, 614, DIG. 62, 156/DIG. 98; 437/241, 99

[56] References Cited

U.S. PATENT DOCUMENTS

| | | | |
|---|---|---|---|
| 3,421,055 | 1/1969 | Bean et al. | 156/610 |
| 3,620,833 | 11/1971 | Gleim et al. | 148/174 |
| 4,076,573 | 2/1978 | Shaw et al. | 156/613 |
| 4,462,847 | 7/1984 | Thompson et al. | 156/614 |
| 4,497,683 | 2/1985 | Celler et al. | 156/DIG. 64 |
| 4,534,820 | 8/1985 | Mori et al. | 156/DIG. 64 |
| 4,637,127 | 1/1987 | Kurogi et al. | 156/614 |
| 4,657,603 | 4/1987 | Kruehler et al. | 148/175 |
| 4,786,615 | 11/1988 | Liaw et al. | 156/613 |

FOREIGN PATENT DOCUMENTS

| | | | |
|---|---|---|---|
| 244081 | 11/1987 | European Pat. Off. | 156/610 |
| 59-45996 | 3/1984 | Japan | 156/614 |

OTHER PUBLICATIONS

Jodus et al, Simultaneous Polycrystalline and Monocrystalline Epitaxial Silicon Growth, IBM Technical Disclosure Bulletin, vol. 14, No. 7, Dec. 1971, p. 2100.
Jastrzebski et al., Growth Process of Silicon Over SiO$_2$ by CVD: Epitaxial Lateral Overgrowth . . . , Jour. of Electrochem. "Solid State Science and Tech", vol. 13C, No. 7, pp. 1571–1580.
A. G. Abdullayev et al., "The Simultaneous Growth of Monocruystalline and Polycrystalline Silicon Films with Controlled Parameters", May 1984, vol. 115, No. 3, pp. 237–243.
J. M. Hong, et al., "Selective-Area Epitaxy of GaAs Through Silicon Dioxide Windows by Molecular Beam Epitaxy," Jan. 1986, vol. 48 No. 2, pp. 142–144.
D. D. Rathman et al., "Lateral Epitaxial Overgrowth of Silicon on SiO$_2$," Oct. 1982, vol. 129, No. 10, pp. 2303–2306.
J. D. Filby et al., "Single-Crystal Films of Silicon on Insulators," Oct. 1967, vol. 18, No. 10, pp. 1357–1382.
J. W. Matthews, "Epitaxial Growth," published by Academic Press, 1975, pp. 12, 21, 413 and 428.

*Primary Examiner*—Robert Kunemund
*Attorney, Agent, or Firm*—Fitzpatrick, Cella, Harper & Scinto

[57] ABSTRACT

A crystal article comprises;

a substrate having i) a nonnucleation surface ($S_{NDS}$) having a small nucleation density, ii) at least one single-nucleation surface ($S_{NDL}$-S) provided adjacent to said nonnucleation surface ($S_{NDS}$), having an area small enough for a crystal to grow from only a single nucleus and having a larger nucleation density ($ND_L$) than the nucleation density ($ND_S$) of said nonnucleation surface ($S_{NDS}$), and iii) at least one multiple-nucleation surface ($S_{NDL}$-M) having an area large enough for crystals to grow from plural nuclei and having a larger nucleation density ($ND_L$) than the nucleation density ($ND_S$) of said nonnucleation surface ($S_{NDS}$);

at least one monocrystal grown from said single nucleus and extending over said single-nucleation surface ($S_{NDL}$-S) to cover part of said nonnucleation surface ($S_{NDS}$); and a polycrystalline film grown from said plural nuclei to cover said multiple-nucleation surface.

3 Claims, 6 Drawing Sheets

POLYCRYSTALLINE   MONOCRYSTALLINE

CRYSTAL ARTICLES AND METHOD FOR FORMING THE SAME

This application is a continuation, of application Ser. No. 07/735,762, filed Jul. 29, 1991, now abandoned, which, in turn, is a continuation of application Ser. No. 07/414,725, filed Sep. 28, 1989, now abandoned, which, in turn, is a continuation of application Ser. No. 07/173,653, filed Mar. 25, 1988, now abandoned.

BACKGROUND OF THE INVENTION

1. Field of the Invention

The present invention relates to a crystal and a method for the growth of a crystal. More particularly, it is concerned with a crystal article comprising a substrate on which single crystals and polycrystals are formed in a controlled manner, and a method for the formation of the same. 2. Related Background Art Monocrystalline thin films used in semiconductor devices or optical devices have hitherto been formed by epitaxial growth on a monocrystalline substrate. For example, on a Si monocrystalline substrate (or silicon wafer), Si, Ge, GaAs or the like is known to be epitaxially grown from a liquid phase, gaseous phase or solid phase. On a GaAs monocrystalline substrate, monocrystals of GaAs, GaAlAs or the like are also known to be epitaxially grown. Using semiconductor thin films thus formed, semiconductor devices, integrated circuits, light-emitting devices such as semiconductor lasers and 1 LEDs, etc. are fabricated.

Recently, research and development were also made extensively on very high-speed transistors employing two-dimensional electron gas, super lattice devices utilizing a quantum well, but it is the high precision epitaxial technique as exemplified by MBE (molecular-beam epitaxy) using ultra-high vacuum, MOCVD (metal organic chemical vapor deposition), etc. that has made these possible.

In the epitaxial growth effected on such a monocrystalline substrate, it is required to adjust the lattice constant and thermal expansion coefficient between the monocrystalline material of the substrate and the epitaxial growth layer. An insufficiency in this adjustment may result in growth of a lattice defect in an epitaxial layer. It may also occur that the elements constituting the substrate are diffused in the epitaxial layer.

Thus, the conventional method of forming a monocrystalline thin film by the epitaxial growth is seen to greatly depend on the materials of the substrate. Mathews et al have examined the combination of the substrate material with the epitaxial growth layer (see EPITAXIAL GROWTH, Academic Press, New York, 1975, ed. by J. W. Mathews).

Also, size of the substate is 6 inches or so at present in the case of Si wafers, and more further progress is needed in making GaAs or sapphire substrates larger in size. In addition, the monocrystalline substrates involve high production cost, making high the cost per chip.

Thus, the formation of monocrystalline layers capable of fabricating devices of good quality according to the conventional methods has involved the problem that the kinds of substrates are limited to a very narrow range.

On the other hand, research and development have been also made extensively in recent years on three-dimensional integrated circuits formed by laminating semiconductor devices in the normal direction of a substrate to achieve a highly integrated and multifunctional state. Research and development are also extensively being made year by year on large area semiconductor apparatus in which devices are set in array on an inexpensive glass sheet, such as solar batteries and switching transistors for liquid crystal picture elements.

What is common to both of these is that needed are techniques by which a semiconductor thin film is formed on an amorphous insulating material and electronic devices such as transistors are formed thereon. Particularly sought after among these is a technique by which monocrystalline semiconductors of high quality are formed on an amorphous insulating material.

In general, the build-up of a thin film on the amorphous insulating material such as $SiO_2$ may make amorphous or polycrystalline the crystalline structure of the built-up film for lack of long-distance order of the substrate material. Here, the amorphous film refers to a film kept in a state that the short-distance order as in most vicinal atoms is retained but there is no long-distance order more than that, and the polycrystalline film refers to a film in which monocrystal grains having no particular crystal direction have gathered in a manner separated at the grain boundaries.

For example, in an instance in which Si is formed on $SiO_2$ by a CVD process, it forms amorphous silicon when the deposition temperature is about 600° C. or less, and, when the temperature is more than that, it forms polycrystalline silicon having grain size distributed in the range of from several hundred to several thousand Å. The Grain size and its distribution of the polycrystalline silicon may greatly vary depending on formation methods.

Polycrystalline thin films having a large grain size of the order of microns or millimeters have been obtained by fusing and solidifying amorphous or polycrystalline films by use of energy beams of lasers, rod-like heaters or the like (see Single Crystal Silicon on Non-single-crystal Insulators, Journal of Crystal Growth, Vol. 63, No. 3, October, 1983, edited by G. W. Cullen).

Measurement of electron mobility based on the properties obtained when transistors are formed on the thus formed thin films of each crystalline structure have revealed that there is attained a mobility of not more than 0.1 $cm^2$/V.sec in the case of amorphous silicon; a mobility of from 1 to 10 $cm^2$/V.sec in the case of polycrystalline silicon having a grain size of several hundred Å; and, in the case of polycrystalline silicon having attained the large grain size by fusion and solidification, a mobility of the same degree as in the case of monocrystalline silicon.

It is seen from these results that there is a great difference in electrical properties between the device formed on the monocrystal area in crystal grains and the device formed across grain boundaries. In other words, the built-up films on amorphous substrates, which are obtained by conventional methods, have the amorphous structure or the polycrystalline structure with a grain size distribution, such that the devices formed thereon have much poorer performance as compared with the devices formed on the monocrystalline layers. For this reason, uses are limited to simple switching devices, solar cells, photoelectric transducers, etc.

Also, in the method of forming the polycrystalline thin films having a large grain size by fusion and solidification, the amorphous or monocrystalline thin film is scanned with energy beams for each wafer. Accordingly, there have been involved the problems such that the method requires much time to make the grain size larger, it is poor in mass-productivity, and it is not suited for achieving a large area.

As stated in above, the conventional crystal growth methods and the crystals fromed thereby can not readily achieve the three-dimensional integration and the large area and have difficulties in practical application to devices, so that it was impossible to easily form and with a low cost the crystals such as monocrystals and polycrystals which are necessary for the fabrication of devices having good properties and multi-functionality.

SUMMARY OF THE INVENTION

An object of the present invention is to provide a method of forming monocrystals and polycrystals that can eliminate the above problems conventionally involved, can readily achieve the three-dimensional integration and the large area, can be practically applied with ease to devices, and can have excellent properties.

Another obect of the present invention, is to provide a crystal article comprising;

- a substrate having i) a nonnucleation surface ($S_{NDS}$) having a small nucleation density, ii) at least one single-nucleation surface ($S_{NDL}$-S) provided adjacent to the nonnucleation surface ($S_{NDS}$), having an area small enough for a crystal to grow from only a single nucleus and having a larger nucleation density ($ND_L$) than the nucleation density ($ND_S$) of the nonnucleation surface ($S_{NDS}$), and iii) at least one multiple-nucleation surface ($S_{NDL}$-M) having an area large enough for crystals to grow from plural nuclei and having a larger nucleation density ($ND_L$) than the nucleation density ($ND_S$) of the nonnucleation surface ($S_{NDS}$);
- at least one monocrystal grown from the single nucleus and extending over the single-nucleation surface ($S_{NDL}$-S) to cover part of the nonnucleation surface ($S_{NDS}$); and
- a polycrystalline film grown from the plural nuclei to cover the multiple-uncleation surface.

Still another object of the present invention, is to provide a method of forming a crystal article, comprising;

- effecting crystal growth on a substrate having i) a nonnucleation surface ($S_{NDS}$) having a small nucleation density, it) at least one single-nucleation surface ($S_{NDL}$-S) having an area small enough for a crystal to grow from only a single nucleus and having a larger nucleation density ($ND_L$) than the nucleation density ($ND_S$) of the nonnucleation surface ($S_{NDS}$), and iii) at least one multiple-nucleation surface ($S_{NDL}$-M) having a larger nucleation density ($ND_L$) than the nucleation density ($ND_S$) of the nonnucleation surface ($S_{NDS}$) and having an area large enough for crystals to grow from plural nuclei; and thereby
- forming a single nucleus on the small nucleation surface ($S_{NDL}$-S) to further allow a monocrystal to grow from the single nucleus so as to cover part of the nonnucleation surface; while
- forming a polycrystalline film on the multiple-nucleation surface ($S_{NDL}$-M).

BRIEF DESCRIPTION OF THE DRAWINGS

FIGS. 1(A) and 1(B) are cross-sections illustrating a process of crystal growth, of which FIG. 1(A) illustrates a state of a substrate right before crystal growth, and FIG. 1(B) illustrates a state of crystals under growth;

FIGS. 2(A) and 2(B) are views illustrating a state of grown crystals, of which FIG. 2(A) is a cross-section and FIG. 2(B) is a top plan view;

FIGS. 4(A) and 4(B) is an view illustrative of of Example 1 to show the relationship between a nucleation surface and grown crystals, of which FIG. 4(A) is a cross-section and FIG. 4(B) is a top plan view;

FIGS. 5(A) to 5(C) are views illustrative of Example 2 to show the relationship between a nucleation surface and grown crystals, of which FIG. 5(A) is a cross-section, FIG. 5(B) is a cross-section after flattening treatment, and FIG. 5(B) is a top plan view; and FIGS. 6(A) to 6(C) are views illustrative of Example 3, of which FIG. 6(A) is a cross-section of a device, FIG. 6(B) is an equivalent circuit of the device, and FIG. 6(C) is a timing chart.

DESCRIPTION OF THE PREFERRED EMBODIMENTS

The present invention utilizes that the nucleation density (ND) of a crystal differs depending on the material of the surface on which the crystal is grown. For example, when an Si crystal is built up, $SiO_2$ has a small nucleation density ($ND_S$), and SiN, a large nucleation density ($ND_L$). And, on a substrate having an $SiO_2$ surface and an SiN surface, the Si crystal is built up to grow only on SiN and does not grow on $SiO_2$, because of the difference ($\Delta ND$) in this nucleation density. The surface having the large nucleation density ($ND_L$) and on which crystals are built up to grow like this is called a nucleation surface ($S_{NDL}$), and the surface having a small nucleation density ($ND_S$) and on which no crystal grows, a nonnucleation surface ($S_{NDS}$). Here, if the area of the nucleation surface ($S_{NDL}$) is kept sufficiently small to the extent that only a single nucleus can be produced, this single nucleus grows extending over the nucleation surface ($S_{NDL}$), also on the nonnucleation surface ($S_{NDS}$).

The present invention makes use of a technique for such selective formation of crystals, thereby making it possible to obtain crystals comprised of monocrystals and polycrystals formed on the same substrate in a controlled manner.

Figure 1A:
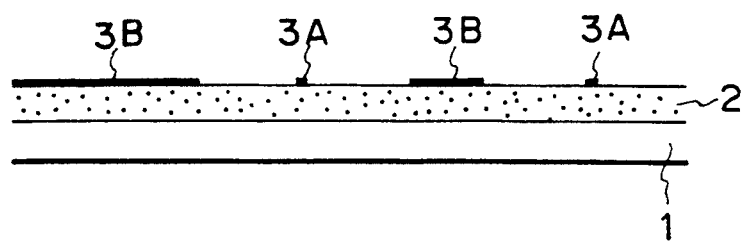

Details of the present invention will be described below with reference to the drawings. In FIG. 1(A), illustrated is a substrate to effect thereon the growth of monocrystals and polycrystals according to the present invention, where used as a base substrate 1 is an insulating substrate made of quartz, heat-resistant glass, alumina, spinel, etc., a semiconductor substrate made of St, Ge, GaAs, InP, etc., or a substrate made of metals such as Mo, Cr, Ti, W, Ta, Al and Fe or an alloy of any of these.

The nonnucleation surface ($S_{NDS}$) 2 is formed by use of materials having a small nucleation density like an $SiO_2$ film. The $SiO_2$ film is formed by techniques such as a heat CVD process, a plasma CVD process, an optical CVD process or a sputtering process. In these techniques, an $SiO_x$ ($x \neq 2$) film may happen to be formed depending on conditions, but, even in such instances, some of them can be used as the nonnucleation surface ($S_{NDS}$) 2.

In instances where the base substrate 1 comprises a crystal silicon substrate, it is possible to oxidize the surface of the silicon substrate by a thermal oxidation process to obtain the $SiO_2$ film.

The nucleation surface ($S_{NDL}$) 3 is constituted of materials having a sufficiently larger nucleation density than the above nonnucleation surface ($S_{NDS}$) 2. A silicon nitride ($Si_xN_y$) film can be used as such materials. The silicon nitride ($Si_xN_y$) film is prepared by a reduced-pressure CVD process or a plasma CVD process. In the reduced-pressure CVD process using $SiH_2Cl_2$ gas and $NH_3$ gas as raw materials and carried out at a substrate temperature of about 800° C. there can be obtained a silicon nitride ($Si_3N_4$) film approximate to the stoichiometric ratio (Si/N=0.75). However, in the silicon nitride ($Si_xN_y$) film formed by RF plasma CVD process, the ratio of content of silicon and nitrogen (Si/N) can be greatly varied by changing the ratio of flow rate of the silicon raw material gas and nitrogen raw material gas. The nucleation density of the nucleation surface ($S_{NDL}$) 3 can be varied by changing the above ratio of content of silicon and nitrogen (Si/N). As the materials for the nucleation surface having large nucleation density, it is possible to use oxides of tantalum ($Ta_2O_5$), oxides of silicon nitride (SiON), etc. besides silicon nitride ($Si_xN_y$) to obtain similar effect Methods for obtaining the nucleation surface having large nucleation density also include a method in which ions of a given substance are implanted to the surface of the nonnucleation surface ($S_{NDS}$) 2 to make this modified area serve as the nucleation surface ($S_{NDL}$) 3. For example, to form the nucleation surface ($S_{NDL}$) 3 for the growth of Si crystals, ion implantation of Si, N, P, B, Ar, He, C, As, Ga, Ge, etc. may be locally made to the surface of the nonnucleation surface ($S_{NDS}$) 2, whereby the nucleation surface ($S_{NDL}$) 3 can be formed. To describe this formation process in detail, first the surface of the nonnucleation surface ($S_{NDS}$) 2 comprised of the $SiO_2$ film or the like is covered with a resist, and any desired portions are exposed to light, developed and dissolved so that the surface of the nonnucleation surface ($S_{NDS}$) 2 is uncovered to the surface to form openings. Subsequently, ions of any desired substances are implanted to the surface of the nonnucleation surface ($S_{NDS}$) 2 through the above openings and thereafter the resist is peeled, thus forming a modified area, i.e., the nucleation surface ($S_{NDL}$) 3 on the nonnucleation surface ($S_{NDS}$) 2. As another method of forming the nucleation surface ($SND_L$) 3 by the ion implantation method, a concentrated Si ion beam may be scanned on the nonnucleation surface ($S_{NDS}$) 2 according to a focusing ion beam (FIB) technique without use of any resist mask, to obtain the nucleation surface ($S_{NDL}$) 3 with a desired pattern and desired arrangement.

Figure 3:
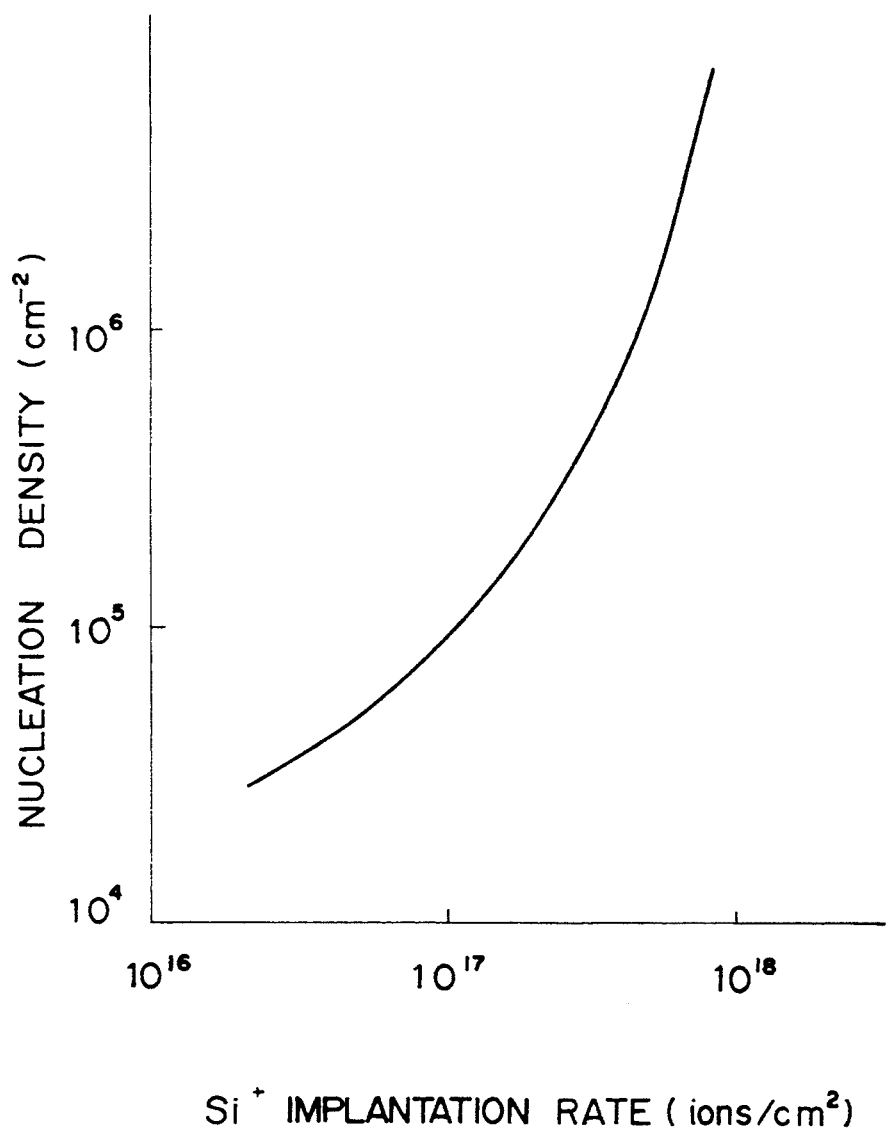
FIG. 3 is a graph showing the relationship between the rate of Si-ion implantation to $Si_2$ surface and the nucleation density.

A feature in the method employing the above ion implantation process is that it is possible to control the nucleation density by only controlling the rate of ion implantation. FIG. 3 is a Graph showing the relationship between the rate of ion implantation and Si-nucleation density when Si ions are implanted on a thermally oxidized $SiO_2$ film. As shown in the graph, the nucleation density of Si crystals is seen to unequivocally change depending on the Si-ion implantation rate.

A single nucleation surface ($S_{NDL}$-S) 3A and a multiple nucleation surface ($S_{NDL}$-M) 3B will be described below.

The single nucleation surface 3A and the multiple nucleation surface 3B may be constituted of materials of the same quality and composition or may be constituted of different quality and composition. Accordingly, it is possible that the area of the multiple nucleation surface ($S_{NDL}$-M) 3B is smaller than the area of the single nucleation surface ($S_{NDL}$-S) 3A when the quality and composition of the multiple nucleation surface ($S_{NDL}$-M) 3B is different from the quality and composition of the single nucleation surface ($S_{NDL}$-S) 3A and the nucleation density of the multiple nucleation surface ($S_{NDL}$-M) 3B is larger than the nucleation density of the single nucleation surface ($S_{NDL}$-S) 3A. Thus, in the present invention, no direct designation is made in relation to the areal relationship between the single nucleation surface ($S_{NDL}$-S) 3A and the multiple nucleation surface ($S_{NDL}$-M) 3B, and the respective areas are defined from the viewpoint that only one monocrystal grown from only a single nucleus is formed on the single nucleation surface ($S_{NDL}$-S) 3A and a plurality of crystals grown from plural nuclei are obtained on the multiple nucleation surface ($S_{NDL}$-M) 3B. Thus, the fact that the areas of the single nucleation surface ($S_{NDL}$-S) 3A and multiple nucleation surface ($S_{NDL}$-M) 3B are not in any direct relationship to mutually have the degree of freedom is also important from the viewpoint of assuring the degree of freedom in designing a device employing the monocrystal and polycrystal formed on the respective surfaces.

Of course, in a limitative instance in which the single nucleation surface ($S_{NDL}$-S) 3A and the multiple nucleation surface ($S_{NDL}$-M) 3B are constituted of the same kind of materials and the above monocrystal and polycrystal are formed by the same process, the area of the multiple nucleation surface ($S_{NDL}$-M) 3B must be larger than that of the single nucleation surface ($S_{NDL}$-S) 3A.

Crystal growth effected on the substrate formed with the constitution and by the process as described above will be described below. A liquid phase growth system, a gaseous phase growth system, etc. can be used as the crystal growth system, and a thermal CVD process, a plasma CVD process, an optical CVD process, an MOCVD process, etc. can be used as the gas phase growth system. Herein, however, description will be made by taking the thermal CVD process as an example.

As materials for the growth, there can be used semiconductors such as silicon (Si), gallium arscenic (GaAs), indium phosphorous (InP), zinc selenide (ZnSe) and zinc sulfide (ZnS), insulating materials such as diamond (C), or metals such as tungsten (W). Here, however, description will be made taking silicon (Si) as an example.

Figure 2A:
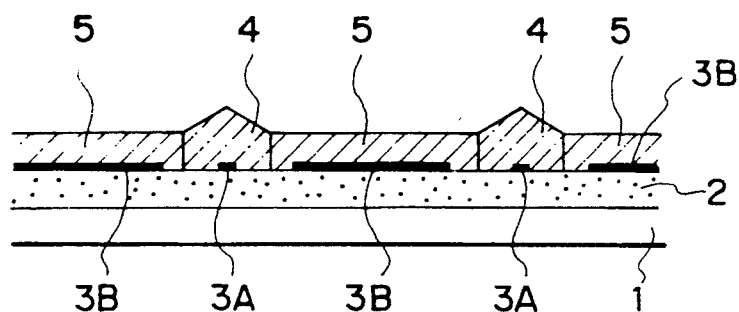

First, the substrate shown in FIG. 2(A) is set in a thermal CVD apparatus, and the substrate temperature is raised to a given degree, followed by flowing a carrier gas and then a silicon source gas mixed in the carrier gas to cause Si crystals to grow. In the thermal CVD process, generally used is a substrate temperature of from 600° C. to 1,200° C. particularly desirably from 800° C. to 1,100° C. Used as the carrier gas is $H_2$ Gas and used as the silicon source gas are $SiH_4$, $SiH_2Cl_2$, $SiHCl_3$, $SiCl_4$, $SiF_4$, etc. HCl gas may also be optionally used as an additional gas.

Figure 1B:
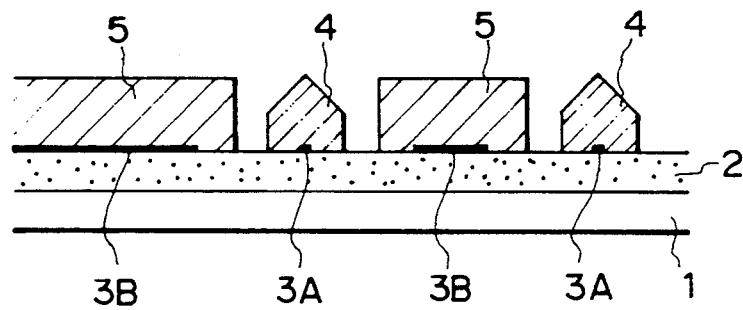

Applying the Si crystal treatment as described above, Si crystals Grow only from the nucleation surfaces ($S_{NDL}$) 3A and 3B as shown in FIG. 1(B) and do not grow from the $SiO_2$ film. Only the monocrystal is formed from the single nucleation surface ($S_{NDL}$-S) 3A and a monocrystal 4 grows from this single nucleus until it covers the SiO₂ film. In the instance where the Si₃N₄ film formed by the above reduced pressure CVD process is used as the single nucleation surface ($S_{NDL}$-S) 3A under the above conditions for the Si crystal growth treatment, the size of the single nucleation surface ($S_{NDL}$-S) 3A is preferably 10 μm or smaller, more preferably 5 μm or smaller, optimally 1 μm or smaller.

On the other hand, in the course of the above crystal growth treatment, plural nuclei are formed on the multiple nucleation surface ($S_{NDL}$-M) 3B and an Si polycrystal grows thereon, where the growth further proceeds until they cover the SiO₂ film. At this time, the grain size of the Si polycrystal in the multiple nucleation surface ($S_{NDL}$-M) 3B at least depends on the nucleation density of the multiple nucleation surface ($S_{NDL}$-M) 3B, where the larger the nucleation density is, the smaller the grain size becomes, or the smaller the nucleation density is, the grain size becomes larger. The size of a multiple-nucleation surface is desired to e large enough to allow as many nucleation as possible, and is preferably 20 μm or larger, more preferably 30 μm or larger.

Figure 2B:
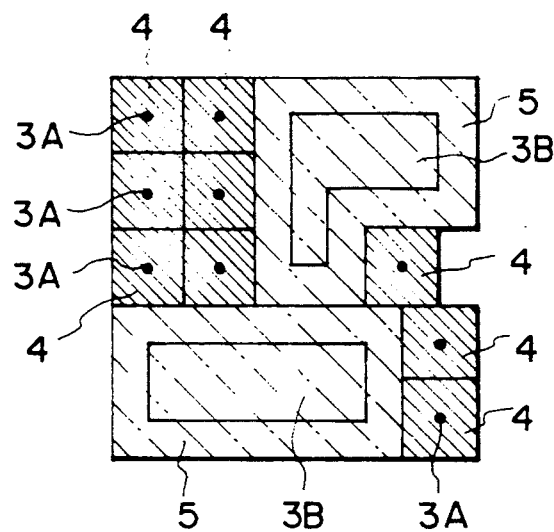

FIG. 2(A) is a view illustrating a cross-section of grown crystals, and FIG. 2(B), a top plan view thereof. As shown in FIG. 2(A) and FIG. 2(B), the technique presented by the present invention can achieve simultaneously the formation of Si monocrystals 4 and polycrystals 5 on any desired base substrate 1. The respective monocrystals and polycrystals can be formed in a controlled manner at any desired positions and in any desired shapes. The monocrystals and polycrystals thus formed are of sameness in the material and also can cover the whole surface of the substrate. Accordingly, the surface can be readily flattened. It is also readily possible to separate the respective monocrystals by the etching of grain boundaries of the respective monocrystals and to re-work the polycrystal areas into any desired shapes according to a photolithographic process.

The grain boundaries of the above respective monocrystals can be formed at substantially the central position of a plurality of single nucleation surfaces ($S_{NDL}$-S) 3A, thus making it possible to carry out the separation of the monocrystals at the grain boudary areas by the above etching, by using a photomask designed and prepared in advance.

EXAMPLE 1

Figure 4A:
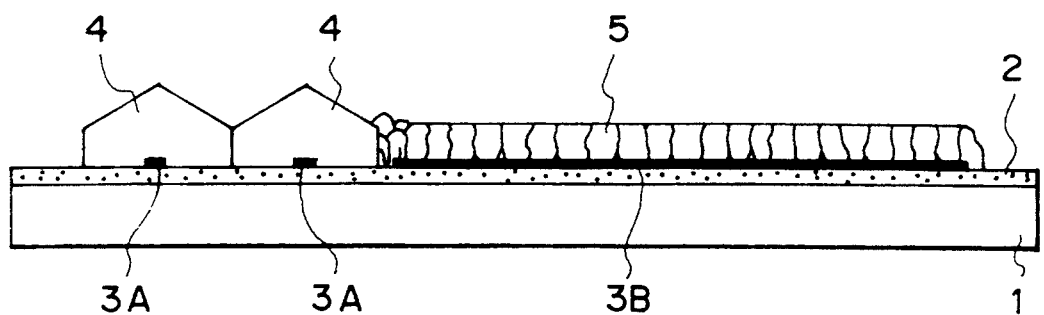
Figure 4B:
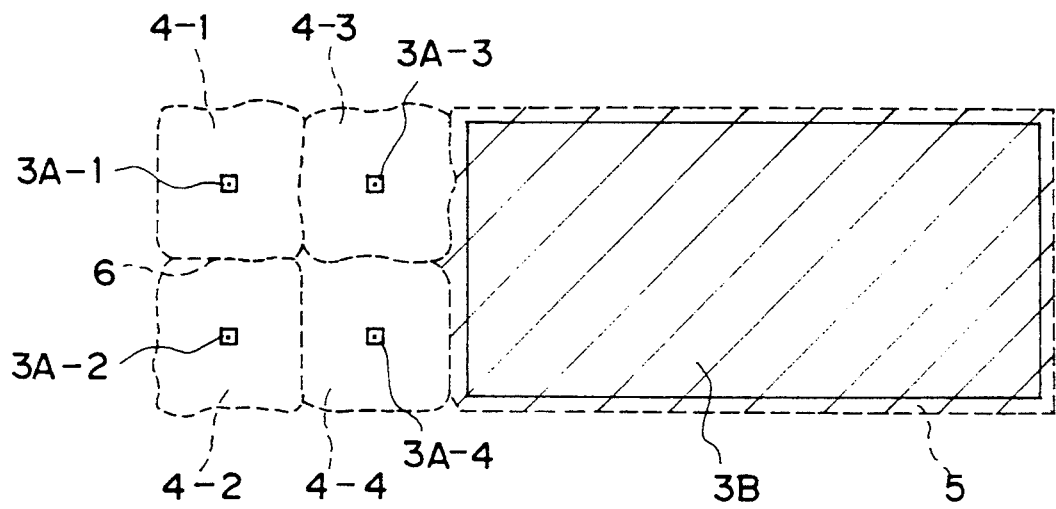

On an alumina substrate an SiO₂ film was built up with a thickness of about 500 Å by sputtering using Ar gas. Thereafter, a silicon nitride film was formed by using the reduced-pressure CVD process using SiH₂Cl₂ gas and NH₃ gas as source gases at a substrate temperature of 800° C. Auger electron spectroscopy revealed that the Si/N ratio in the silicon nitride ($Si_xN_y$) film was about 0.8. Subsequently, the above silicon nitride film was subjected to patterning by the photolithographic process to form four single nucleation surfaces ($S_{NDL}$-S) 3A-1 to 3A-4 and one multiple nucleation surface ($S_{NDL}$-M) 3B as shown in FIG. 4(A) and FIG. 4(B). At this time, the single nucleation surfaces had shapes of squares with a side of 1.0 μm each, and mutual distance thereof were 10 μm. The multiple nucleation surface ($S_{NDL}$-M) was also made to have a shape of a rectangle of 20 μm long and 40 μm broad. This substrate was set in an epitaxial growth apparatus to allow Si crystals to grow under the conditions of a substrate temperature of 1,030° C. a gas flow rate of SiH₂Cl₂/HCl/H₂=1.2 lit/min/1.5 lit/min/100 lit/min and a total pressure of 175 Tort. As a result, four monocrystals uniformly having a grain size of about 10 μm were found to have grown from the single nucleation surfaces ($S_{NDL}$-S) 3A-1 to 3A-4, and the grain boundaries 6 were positioned substantially at the centers of the segments connecting the respective single nucleation surfaces.

On the other hand, on the multiple nucleation surface ($S_{NDL}$-M) 3B, there growed a polycrystal having an average grain size of about 1.5 μm. This polycrystal had grown extending over the multiple nucleation surface ($S_{NDL}$-M) 3B to have grown also on the SiO₂ film, coming in contact on the SiO₂ film with the monocrystals grown from the above single nucleation surfaces ($S_{NDL}$-S) 3A-3 and 3A-4 to form grain boundaries.

EXAMPLE 2

On a fused quartz substrate the plasma CVD process was applied using SiH₄ gas and oxygen gas, diluted with hydrogen gas, to form an $SiO_x$ film with a film thickness of about 1,000 Å. Next, Si-ion implantation was effected only on desired positions on the above $SiO_x$ film with use of a focusing ion beam apparatus. The implantation was carried out under the conditions of an accelerated voltage of 50 keV, a beam diameter of 0.4 μm, and an implantation rate of $2 \times 10^{18}$ cm⁻² at the areas corresponding to the single nucleation surfaces ($S_{NDL}$-S) 3A-5 to 3A-8, and $\times 10^{19}$ cm⁻² at the areas corresponding to the multiple nucleation surfaces ($S_{NDL}$-M) 3B-5 to 3B-8. The single nucleation surfaces ($S_{NDL}$-S) 3A-5 to 3A-8 were made to have shapes of squares with a side of 2.0 μm each, and the multiple nucleation surface ($S_{NDL}$-M), shapes of rectangles of 20 μm long and 30 μm broad each. These single nucleation surfaces were each longwise arranged in a line with a distance of 25 μm between centers, and on the side area thereof the multiple nucleation surfaces were similarly longwise arranged in a line with a distance of 25 μm between centers. Here, the distance between the center of a single nucleation surface and the center of a multiple nucleation surfaces were made to be 28 μm.

Figure 5A:
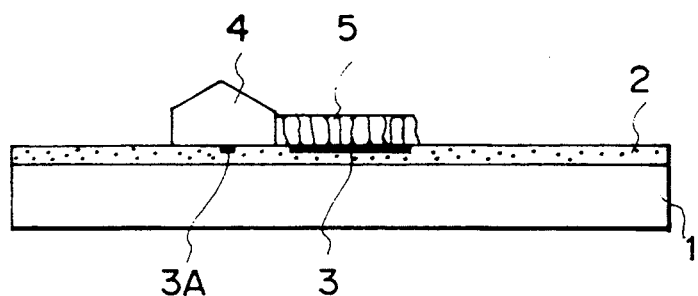

This substrate was set in an epitaxial growth apparatus to allow Si crystals to grow under the conditions of a substrate temperature of 1,030° C., a gas flow rate of SiH₂Cl₂/HCl /H₂=1.7 lit/min/1.3 lit/min/100 lit/min, and a total pressure of 175 Torr. As a result, there were obtained monocrystals 4-5 to 48 and polycrystals 5-5 to 5-8 as shown in the cross-section of FIG. 5(A) and the plan view of FIG. 5(C). The monocrystals 4 had a grain size of about 25 μm, and the polycrystals 5, an average grain size of about 0.5.

The resulting crystals were flattened on these surfaces by mechanical grinding and chemical Grinding to obtain a flat crystal thin film with average thickness of about 3 μm for both the monocrystals 4 and polycrystals 5.

EXAMPLE 3

Figure 5B:
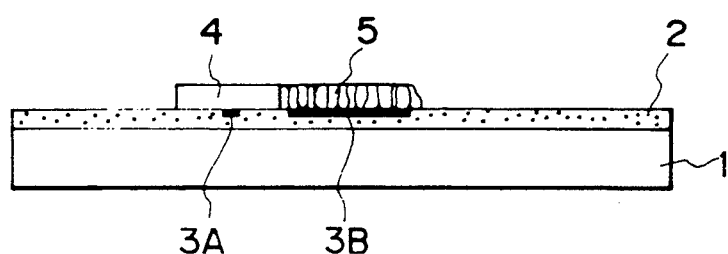
Figure 5C:
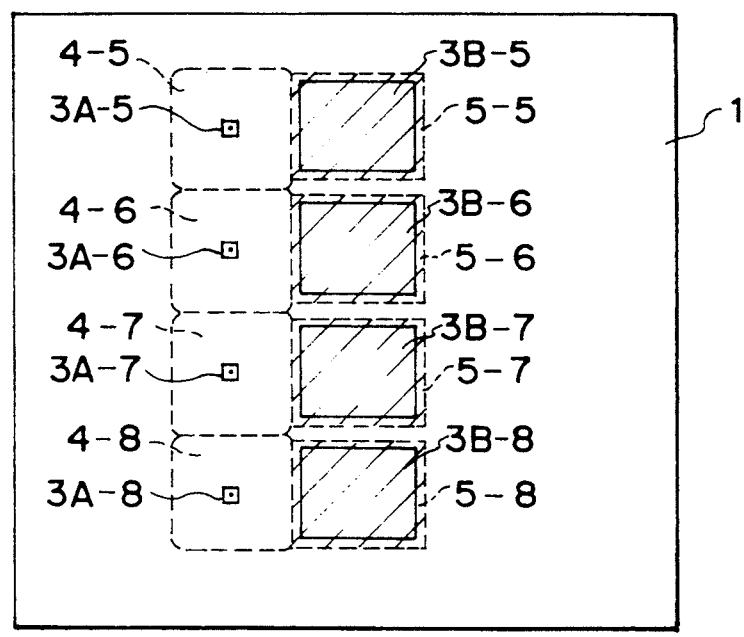
Figure 6A:
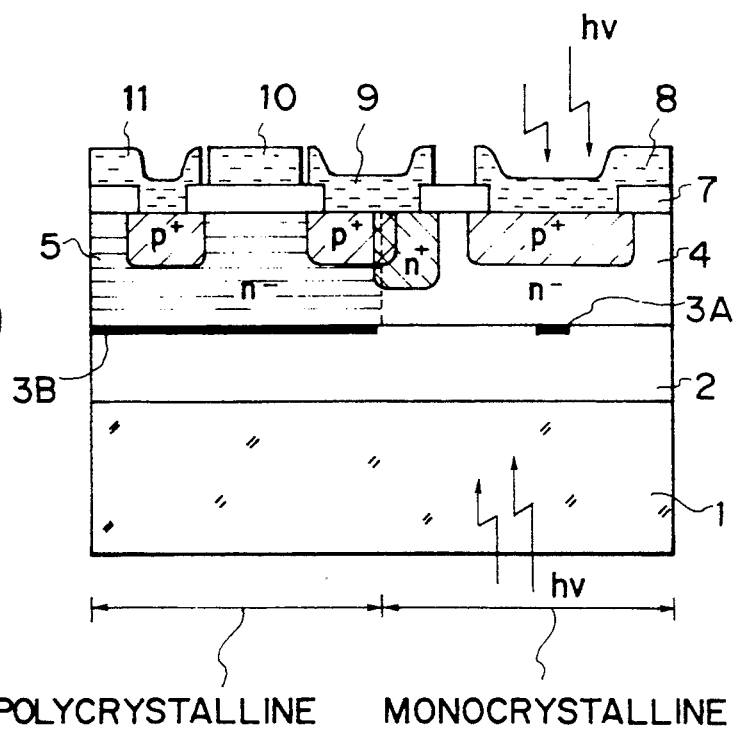
Figure 6B:
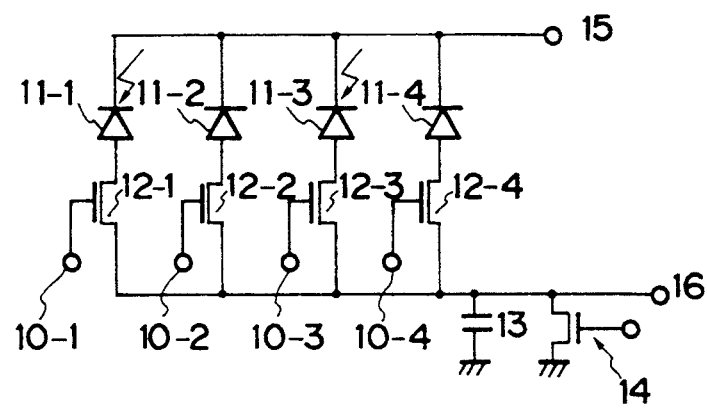

On the flattened crystalline thin film (FIG. 5(B)) prepared in Example 2, a circuit as shown in FIG. 6(B) was prepared. Photodiodes were prepared on the monocrystalline areas 4, and switching MOS transistors, on the polycrystalline areas 5. A cross-section of the device at this time is shown in FIG. 6(A). In FIG. 6(A), the numeral 7 denotes the SiO₂ film formed by the CVD process; 8 to 11, electrodes comprising transparent conductive films, wherein, 8, an electrode of the photodiode; 9, a source electrode of the MOS transistor; 10, a gate electrode; and 11, a drain electrode.

Figure 6C:
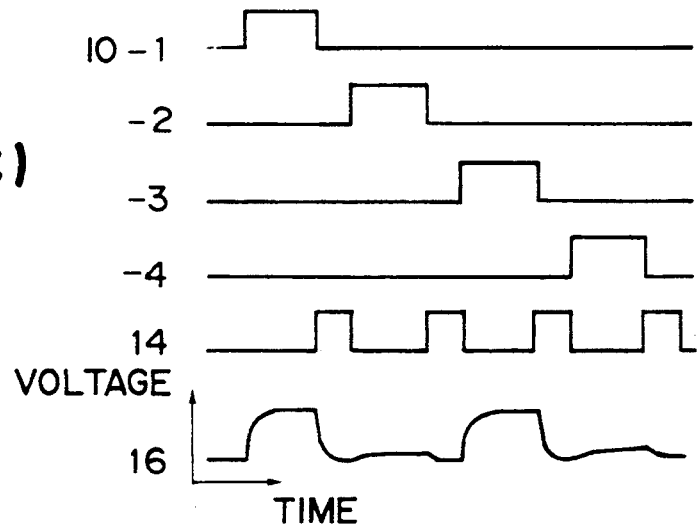

The photodiodes were made to have shapes of squares with about 10 μm square each at the junction portion, and the MOS transistors, to have a channel length of 4 μm and a channel width of 6 μm for each. At this time, the MOS transistors had a field-effect mobility of about 3.0 cm$^2$/V.s and a threshold voltage of about 3.5 V. To terminals 10-1 to 10-4 and 14 as shown in FIG. 6(B), pulses as shown in the timing chart of FIG. 6(C) were applied, and at the same time a He-Ne laser beam was concentrated to a diameter of about 10 μm and irradiated targeting the photodiodes 11-1 and 11-2 from the surface or reverse side of the quartz substrate to obtain in an output terminal 16 the output wave form as shown in FIG. 6(C). At this time, another He-Ne laser beam was irradiated to MOS transistors 12-1 to 12-4 with similar intensity to have observed little change in the output wave form in the output terminal 6.

This is because the life time of photocarriers in the polycrystalline Si was short, and the employment of the crystal growth method according to the present invention made it possible to simultaneously internally make up the monocrystalline Si having a high sensitivity to light and the polycrystalline Si having a low sensitivity to light on the same substrate. This shows the capability that even mutually disagreeable functions can be readily formed in the same substrate and with use of the same kind of materials, thus suggesting the possibility that multi-functional devices can be readily prepared by the crystal growth method according to the present invention.

What is claimed is:

1. A method for forming a crystal article on a substrate which comprises:
   (a) forming on said substrate a free surface having a nonnucleation surface;
   (b) forming in said nonnucleation surface at least one amorphous single nucleation surface for forming a monocrystal by ion implanting a material in said nonnucleation surface having a nucleation density substantially larger than the material constituting said nonnucleation surface; and at least one amorphous multiple nucleation surface for forming a polycrystal by implanting a material in said nonnucleation surface having a nucleation density substantially larger than the material constituting said nonnucleation surface; wherein each said amorphous single nucleation surface has an area of sufficient size and a nucleation density sufficiently larger than the nucleation density of said nonnucleation surface to selectively form a single nucleus for growing said monocrystal and each said amorphous multiple nucleation surface has an area of sufficient size and a nucleation density sufficiently larger than the nucleation density of said nonnucleation surface to selectively form plural nuclei thereon for growing said polycrystal;
   (c) simultaneously vapor depositing each said single nucleus for forming each said monocrystal on each said amorphous single nucleation surface and each said plural nuclei for forming each said polycrystal on each said multiple nucleation surface; and
   (d) simultaneously growing by vapor deposition each said monocrystal from each said vapor deposited single nucleus and each said polycrystal from each said vapor deposited plural nuclei, wherein each said monocrystal is overgrown on said nonnucleation surface.

2. The method of forming a crystal article of claim 1, wherein each said single nucleation surface an each said multiple nucleation surface are simultaneously formed by depositing a material having a nucleation density substantially larger than the material constituting said nonnucleation surface on said nonnucleation surface, followed by patterning according to lithography.

3. The method of forming a crystal article of any one of claims 1 or 2, wherein the position and size of each said monocrystal are controlled by the spacing between said single nucleation surface and multiple nucleation surface.

* * * * *

UNITED STATES PATENT AND TRADEMARK OFFICE
CERTIFICATE OF CORRECTION

PATENT NO. : 5,364,815
DATED : November 15, 1994
INVENTOR(S) : YOSHIYUKI OSADA

It is certified that error appears in the above-identified patent and that said Letters Patent is hereby corrected as shown below:

ON TITLE PAGE

In [56] References Cited, under OTHER PUBLICATIONS: "Monocruystalline" should read --Monocrystalline--.

COLUMN 1

Line 19, "same. 2. Related" should read --same. ¶ 2. Related--.
Line 31, "1 LEDs," should read --LEDs,--.

COLUMN 2

Line 31, "Grain" should read --grain--.
Line 62, "uses" should read --uses thereof--.

COLUMN 3

Line 5, "fromed" should read --formed--.
Line 21, "obect" should read --object--.

COLUMN 4

Line 30, "And, on" should read --On--.

COLUMN 5

Line 58, "Graph" should read --graph--.

COLUMN 6

Line 46, "arscenic" should read --arsenic--.
Line 64, "Grow" should read --grow--.

UNITED STATES PATENT AND TRADEMARK OFFICE
CERTIFICATE OF CORRECTION

PATENT NO. : 5,364,815
DATED : November 15, 1994
INVENTOR(S) : YOSHIYUKI OSADA

It is certified that error appears in the above-identified patent and that said Letters Patent is hereby corrected as shown below:

COLUMN 7

Line 19, "e" should read --be--.
Line 20, "nucleation" should read --nucleation sites--.
Line 42, "boudary" should read --boundary--.
Line 68, "Tort." should read --Torr.--.

COLUMN 8

Line 26, "$\times 10^{19} cm^{-2}$" should read --$3 \times 10^{19} cm^{-2}$--.
Line 45, "48" should read --4-8--.
Line 52, "Grinding" should read --grinding--.
Line 66, "8, an" should read --8 is an--.

COLUMN 10

Line 29, "an" should read --and--.
Line 39, "multiple" should read --said multiple--.

Signed and Sealed this

Twenty-third Day of May, 1995

Attest:

BRUCE LEHMAN

*Attesting Officer*      *Commissioner of Patents and Trademarks*